United States Patent [19]
Lee et al.

[11] Patent Number: 6,031,981
[45] Date of Patent: Feb. 29, 2000

[54] RECONFIGURABLE GATE ARRAY CELLS FOR AUTOMATIC ENGINEERING CHANGE ORDER

[75] Inventors: Kuochun Lee, Fremont; Tsung-Yen Chen, Milpitas; Fong Jim Wang, Belmont, all of Calif.

[73] Assignee: Cirrus Logic, Inc., Fremont, Calif.

[21] Appl. No.: 08/769,964

[22] Filed: Dec. 19, 1996

[51] Int. Cl.[7] .................................................. G06F 15/20
[52] U.S. Cl. .............................. 395/500.11; 395/500.14
[58] Field of Search ...................................... 364/490, 491

[56] References Cited

U.S. PATENT DOCUMENTS

| | | | |
|---|---|---|---|
| 4,484,292 | 11/1984 | Hong | 364/491 |
| 5,111,413 | 5/1992 | Lazansky et al. | 364/578 |
| 5,519,628 | 5/1996 | Roussel et al. | 364/489 |
| 5,604,680 | 2/1997 | Bamji et al. | 364/491 |

OTHER PUBLICATIONS

Cell3 Ensamble™ Ref. Manual; Version 4.5; Dec. 1995; CADENCE.

Primary Examiner—Kevin J. Teska
Assistant Examiner—Thuan Do
Attorney, Agent, or Firm—Wagner, Murabito & Hao LLP

[57] ABSTRACT

A method and system to efficiently incorporate engineering change order (ECO) modifications into an integrated circuit layout having configurable gate array cells is provided. In generating the original integrated circuit layout, extra gate array cells are inserted into the layout. These gate array cells can be reconfigured to modify their functionality according to changes specified by the ECO. A new netlist with a description of the required modifications is generated and provided to a place-and-route CAD tool to create a new layout of the integrated circuit.

16 Claims, 5 Drawing Sheets

RECONFIGURABLE GATE ARRAY CELLS FOR AUTOMATIC ENGINEERING CHANGE ORDER

FIELD OF THE INVENTION

The invention generally relates to computer-aided design techniques for very large scale integrated circuits, and more particularly relates to a method and system for automatically implementing engineering change order modifications.

BACKGROUND OF THE INVENTION

Rapid advances of very large scale integrated circuit (VLSI) technologies have made design of integrated circuits increasingly complex and time consuming. Computer-Aided Design (CAD) has become a necessity to speed up and improve the quality of VLSI design. Of all the phases in designing application specific VLSI circuits, physical layout takes up a major portion of the turn-around time.

In creating a physical layout of an application specific VLSI circuit, a computer layout is first generated. Generally, the computer layout is created by arranging a number of individual blocks or "logic cells" according to predetermined schematics. The functionality and design of individual logic cells may be predetermined and stored on a computer system as a standardized design. Such design techniques can save considerable time, as it is no longer necessary for an integrated circuit designer to custom design each individual gate and transistor in an integrated circuit. Rather, the circuit designer breaks down a new circuit design into a number of known (or new) cell designs and then combines these cells appropriately to generate a circuit design which performs a desired function. Each of the logic cells contains a number of terminals for implementing into the integrated circuit. These logic cells are commercially available.

To "tape-out" such a computer layout, commercial "place-and-route" CAD tools, such as Cell3™ from Cadence Design Systems, Inc., of San Jose, Calif., can be utilized. More particularly, place-and-route CAD programs are used 1) to arrange logic cells and other elements to optimize their interconnections and the overall surface area and 2) to define the routing region and to select channels to connect the logic cells and elements. To perform the tasks mentioned above, a place-and-route CAD tool requires as input a predetermined number (including reserves) of predefined logic cell types (e.g., AND-gate, OR-gate, flip-flop, etc.). Information related to the logic cells along with the required terminal connections are provided to the place-and-route CAD tool in a data file called "netlist". In response, the place-and-route CAD tool outputs a computer layout.

Using the computer layout generated as a blueprint, a number of base, contact, and metal layers defining the elements and interconnections of the VLSI circuit are created in silicon through a combination of semiconductor processes namely depositing, masking, and etching. When combined, these layers form the VLSI circuit. Depending on the complexity of the application specific VLSI circuit, each circuit may involve multiple base layers, multiple contact, and multiple metal layers. This process is widely known as tape-out.

Following tape-out, for various reasons including design changes, modifications are subsequently required to delete as well as add logic elements and interconnections from the VLSI circuit. When this occurs, an engineering change order (ECO) is generated to document the desired changes. Next, the computer layout generated earlier is modified using the commercial place-and-route CAD tool to incorporate the desired changes. Under the prior art, extra logic cells of different types are included in the original computer layout as reserves in case new elements are needed. However, due to limitations inherent in the software environment (e.g., capability to handle a limited number of variables), the place-and-route CAD tool requires that these extra logic cells be of predefined types and numbers. Because the types of the logic cells are predefined as AND gates, OR gates, flip-flops, etc., modifications are limited to changing the logic cells connectivity. Such inflexibility may cause disastrous consequences. For example, in adding logic elements as required under an ECO, a logic cell of a certain type may not be available for implementing a desired function. As a result, either the desired function must be deleted or the process of generating a computer layout with the desired logic cells must be restarted. As such, neither one of these options are desirable.

Even if the right type logic cells are available for adding, the layout engineer must still make the proper connections. Because the locations of the logic cells are fixed, it is sometimes not possible to provide the desired connections given existing obstacles and various space constraints in the layout. In addition, it is a painful and time consuming task to identify the extra logic cells and provide the proper wiring to properly connect the added cells. Because of the increasing complexity of VLSI circuits, the layout engineer must work with as many as four different layout layers at a time. Given the complexity of the task, under the prior art, the turn-around time to incorporate the desired ECO changes is generally high.

Thus, a need exists for a system and method to preserve as much of the information generated from the original layout as possible to allow ECO changes to be made faster and more efficiently.

SUMMARY OF THE INVENTION

Accordingly, the present invention provides a system, and method to provide more flexibility in incorporating ECO modifications to existing layouts and to allow ECO modifications to be made more efficiently.

The present invention meets the above need with a computer system adapted to incorporate engineering change order (ECO) modifications to an integrated circuit layout having configurable gate array cells. The computer system comprises a bus, a central processor connected to the bus, and memory connected to the bus.

The memory stores instruction codes which when executed by the central processor compares a first netlist file with a second netlist file. The first netlist file contains a description of the arrangement of the configurable gate array cells and net connections of the configurable gate array cells in the integrated circuit layout. The second netlist file contains a description of ECO modifications to be made to the integrated circuit layout. Next, the executed instruction codes determines from the first and second netlists whether the ECO modifications require additional functionality. Based on the finding, the executed instruction codes configures selected gate array cells to provide the additional functionality as required by the second netlist.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
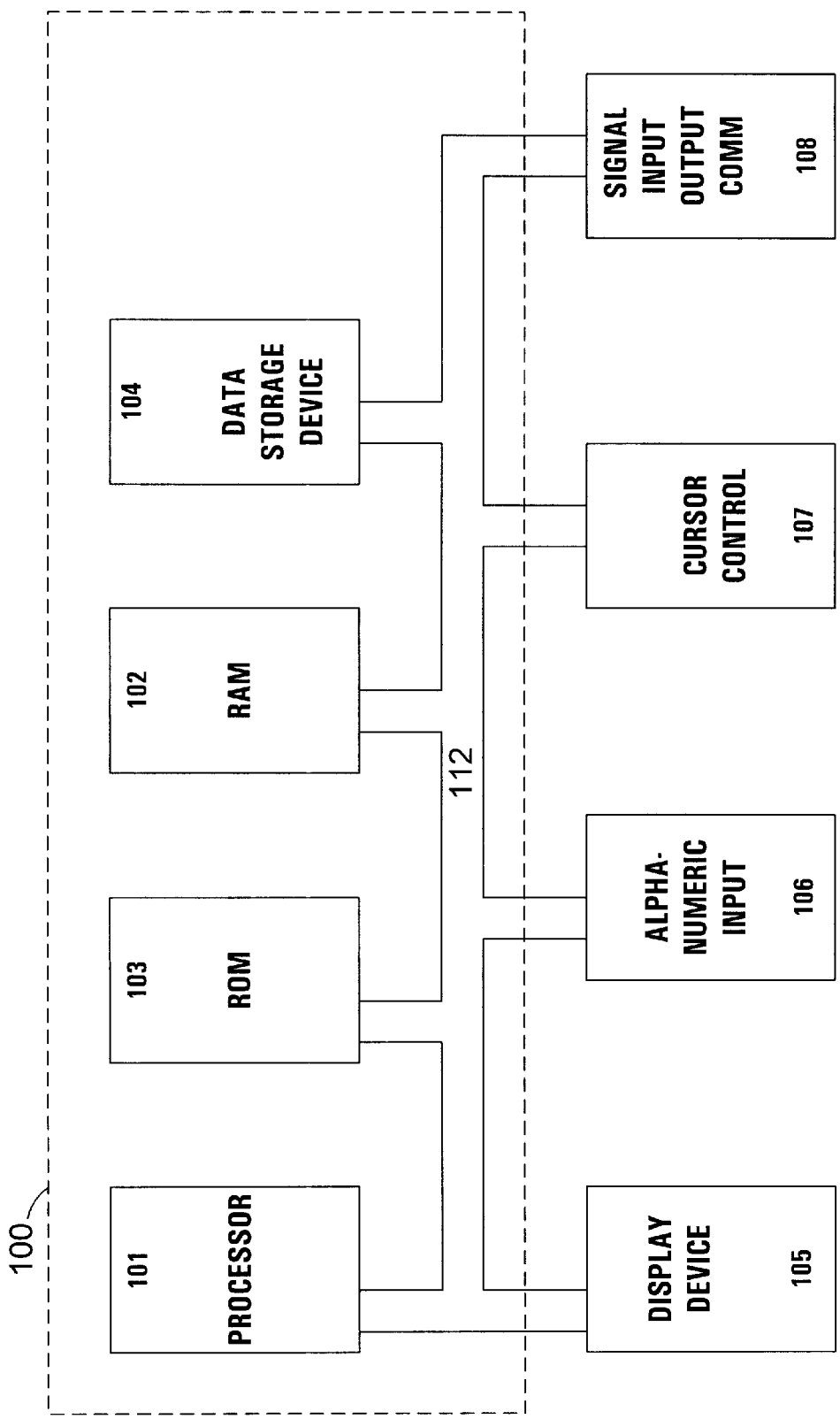
FIG. 1 is a block diagram illustrating a computer system that implements the CAD tools in accordance with the present invention.

Reference is made to FIG. 1 illustrating a block diagram of computer system 100 upon which the present invention may be implemented or practiced. It is to be appreciated that computer system 100 is exemplary only and that the present invention can operate within a number of different computer systems including general purpose computers systems, embedded computer systems, and computer systems specially adapted for electronic design automation. In the following discussions of the present invention, certain processes and steps are realized as a series of instructions (e.g., software program) that reside within computer readable memory units of system 100 and executed by processors of system 100.

In general, computer system 100 used by the present invention comprises address/data bus 112 for conveying information and instructions, one or more processors 101 coupled with bus 112 for processing information and instructions, a random access memory (RAM) 102 for storing digital information and instructions, a read only memory (ROM) 103 for storing information and instructions of a more permanent nature. In addition, computer system 100 may also include a data storage device 104 (e.g., a magnetic, optical, floppy, or tape drive) for storing vast amounts of data, and an I/O interface 108 for interfacing with peripheral devices (e.g., computer network, modem, etc.). Moreover, computer system 100 may include a display device 105 for displaying information to a computer user, an alphanumeric input device 106 (e.g., keyboard), and a cursor control device 107 (e.g., mouse, trackball, lightpen, etc.) for communicating user input information and command selections.

Figure 2:
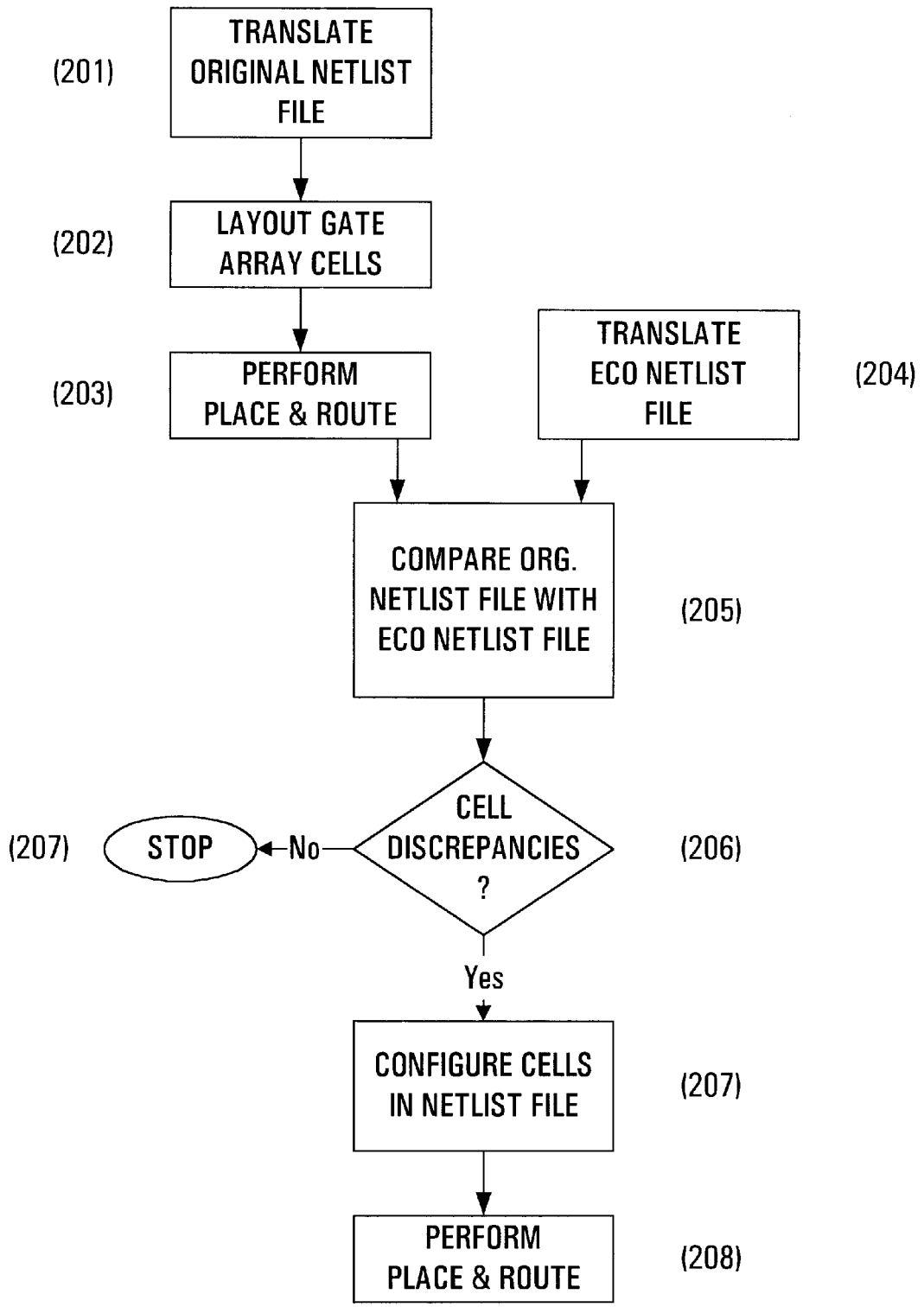
FIG. 2 is a flow chart illustrating the high-level process steps involved in incorporating ECO changes in according with the present invention.

FIG. 2 is a flow chart illustrating the high-level steps involved in incorporating ECO changes in accordance with the present invention. These high-level steps provide an overall picture of the present invention. More detailed description of these steps are provided in association with subsequent figures below. In step 201, a netlist data file is format to work with the place-and-route CAD tool selected. At this point, the netlist data file contains a description of sets of terminals that must be interconnected. Preferably, the net list data file is formatted to the design exchange format (DEF) for place-and-route CAD tool Cell3™, a maze-based router, from Cadence Design Systems, Inc., of San Jose, Calif. Next, through user interaction, power pads, ground pads, corner cells, gap cells, and gate array cells are added to the formatted original netlist in step 202. In doing so, a layout of the VLSI circuit is created.

Using the formatted netlist as input, place-and-route CAD tool Cell3™ is used to determine the routing, placing, wiring, interconnections and general layout of the VLSI circuit (step 203). In general, connections between gate array cells and other standard cells are made by place-and-route CAD tool Cell3™ according to the description provided in the original netlist file. All these information are then saved as part of the formatted netlist file (hereinafter "the original netlist file"). The gate array cells used in the present invention are basically floating transistors which can be manually derrived from standard commercial logic cells by modifying the existing connections. The floating transistors of these modified standard logic cells can then be configured to provide any desired function by making the appropriate connections in the corresponding metal layer. Although discussed here, steps 201–203 are likely performed in advance to generate the original layout used in the first tape-out. Hence, for the sake of efficiency, the original layout can be used over again in incorporating ECO changes.

In response to an ECO, the desired changes (e.g., terminal connections) are compiled in an ECO netlist file which also contains descriptions of sets of terminal connections to be made. The ECO netlist file is also formatted for place-and-route CAD tool Cell3™ (step 204). The original netlist file is compared against the ECO netlist file to determine the changes to be made (step 204). More particularly, step 204 determines whether there are any cell discrepancy between the original netlist file and the ECO netlist file. If any cell discrepancy is detected indicating modifications are required, the wiring in the corresponding metal layer is modified accordingly to reconfigure the selected gate array cells to provide the desired functionality (e.g., as ANDing, an ORing, etc.) (step 207). The base layers are therefore preserved. The ECO netlist file and the original netlist file are merged. The merged netlist file is provided as input to place-and-route CAD tool Cell3™ to determine the new routing, placing, wiring, interconnections and general layout of the VLSI circuit (step 208). Place-and-route CAD tool Cell3™ then outputs a new layout of the VLSI circuit. Hence, most of the information generated from the previous layout is saved and reused. In the unlikely event that no cell discrepancy is detected, no modification is required in the original netlist file.

Figure 3:
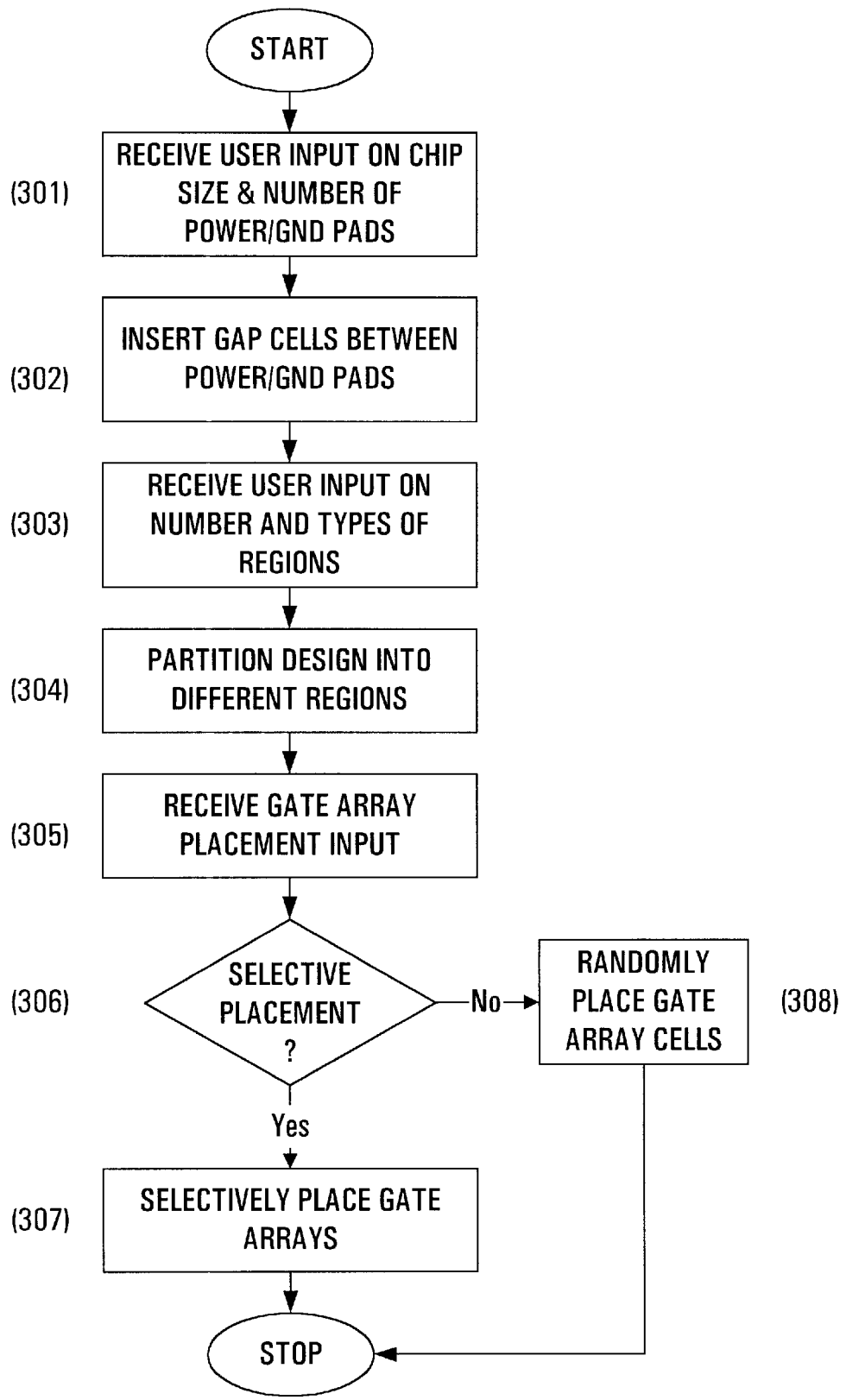
FIG. 3 is a flow chart illustrating the steps of the CAD tool used in generating a layout of the gate array cells in an application specific VLSI circuit in accordance with FIG. 2.

Reference is now made to FIG. 3 illustrating a flow chart of the instruction codes stored in memory of computer system 100 which when executed by processor 101 generates a layout of the array cells as indicated in step 202 of FIG. 2. In step 301, data regarding the chip size and numbers of the power and ground pads are interactively received from the user. By knowing the chip size and the number of the power/ground pads, the power/ground pads can be arranged on the periphery of the chip accordingly. In doing so, the number of gap cells required to fill the gaps around the chip periphery can be determined. The gap cells are then inserted between the power/ground pads in step 302. Four corner cells are placed automatically at the four corners of the layout. Next, data on the number and types of regions are received interactively from the user in step 303. The chip surface area is organized into different regions according to the user input (step 304).

In the preferred embodiment, a user can choose between selective placement of gate array cells or random placement of gate arrays. In selective placement, the user can dictate where gate arrays are to be placed in the layout. More particularly, a user can select the sites/regions by pointing to a site and specifying to the computer the number of gate array cells to be added. On the other hand, in random placement of gate arrays, upon specifying the number of gate array cells to be added, the computer randomly distributes the added gate array cells across the layout according to a predetermined scheme. Placement of gate array cells is performed interactively. In step 305, the gate array placement input is received from the user. If placement of gate array cells is to be done selectively (step 306), further user input including number of gate array cells to be added and locations are expected before placements are carried out as discussed earlier (step 307). If placement of gate array cells is to be done randomly, further user input of the number of gate array cells to be added is expected before they are distributed randomly (step 308). The gate arrays cells inserted can be monitored using a data base linked to the netlist.

Figure 4:
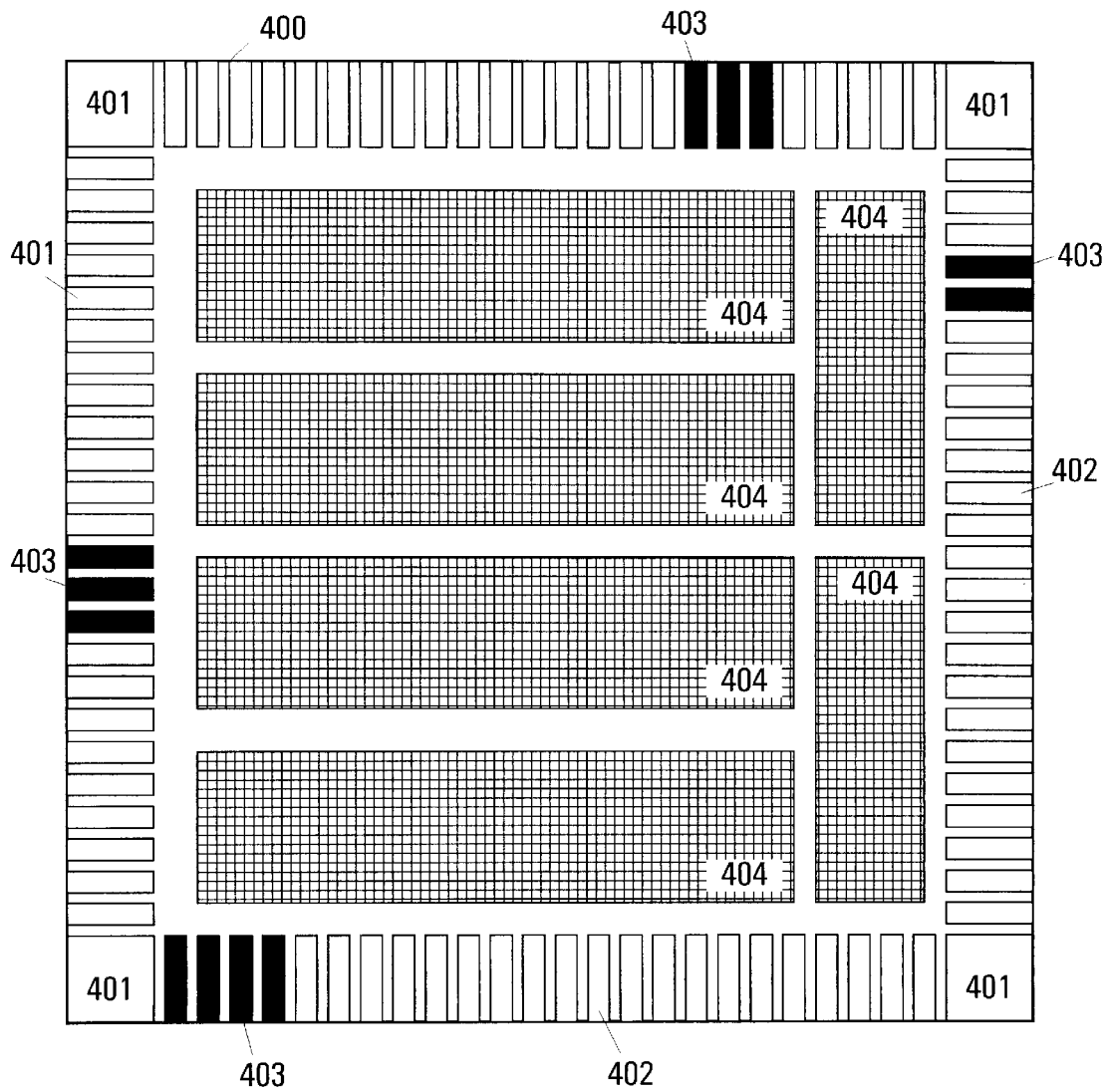
FIG. 4 illustrates an exemplary layout of a VLSI circuit generated by the CAD tool of FIG. 3.

An exemplary VLSI circuit layout generated by the flow chart in FIG. 3 is illustrated in FIG. 4. As shown in FIG. 4, a number of power/ground pads 402 in accordance with the user input are arranged along the periphery of VLSI circuit 400. Four corner cells 401 are placed at the four corners of the circuit layout. Gap cells 403 are inserted as necessary along the periphery to fill the gaps between power/ground pads 420. As further illustrated in FIG. 4, for design purposes the VLSI circuit is also divided into different regions 404. Each region 404 consist of a matrix of rows and columns of gate array cells. Gate array cells to be added in the layout are inserted into the rows of regions 404. Connectivity between the regions, the pads, and gate array cells is made by using wiring patterns on metal layers that overlays the layout shown in FIG. 4. Moreover, connectivity among the gate array cells to configure the cells to provide a desired function (e.g., as an AND-gate, a flip-flop, etc.) can also be made by introducing wiring patterns on the metal layers.

Figure 5:
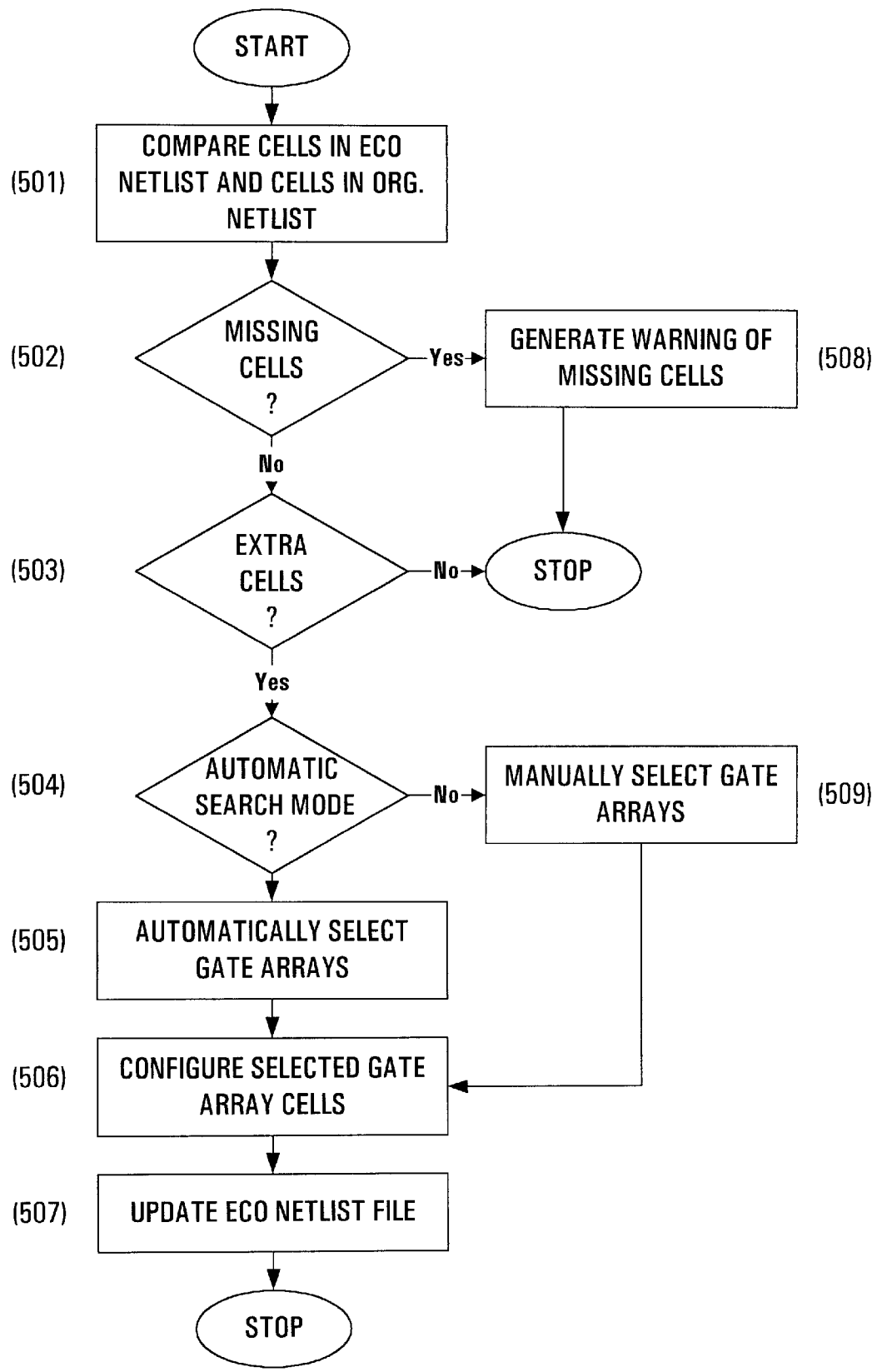
FIGS. 5 is a flow chart illustrating the steps of the CAD tool used in selecting gate array cells and reconfiguring them in accordance with FIG. 2.

Referring now to FIG. 5 illustrating a flow chart of the instruction codes stored in memory of computer system 100 which when executed by processor 101 helps to determine whether or not there are any cell discrepancies between the original netlist file and the ECO netlist file and to reconfigure the gate array cells as needed to incorporate the desired ECO changes. In step 501, the ECO net list file is compared against the original netlist file. In particular, the sets of terminal connections from the ECO netlist file are compared against that of the original net list file. The clues from the terminal connection differences may indicate whether there are gate array cells missing in the ECO netlist file or whether there are extra gate array cells in the ECO netlist file. More specifically, the ECO netlist file is missing cells when the original netlist file utilizes the cells but the ECO netlist file does not. On the other hand, the ECO netlist file contains some extra cells when the it utilizes the cells but the original netlist file does not.

If it is determined that there are some missing cells (step 502), a warning is generated to the user (step 508). When there are some missing cells, some cells have probably been deleted inadvertently and the user needs to double check. If there are no missing cells, it is determined whether the ECO netlist file contains some extra cells (step 503). In the unlikely event that the ECO netlist file also does not contain any extra cells, there is either no cell discrepancies or the ECO modifications only involve connectivity change. When this occurs, the software program is stopped. On the other hand, if it is determined that the ECO netlist file contains some extra cells, steps are taken to reconfigure some cells to provide the desired functions. This is because a determination of extra cells indicates that additional logic functions are required to be implemented by the ECO. The extra cells detected by step 501 and their desired functionality are compiled into a list which is monitored to ensure that the required reconfigurations are carried out.

To help select the most ideal gate array cells to reconfigure, both an automatic search mode and an manual search mode are available in the preferred embodiment. As discussed earlier, gate array cells can be reconfigured by modifying the net connections in the metal layers. As such, gate array cells that locate closest to the geometry center of the cells that are connected by the same net as the cells to be reconfigured are most ideal for reconfiguration. This is the search criteria used for the search algorithm employed in the search mode. As an example, assuming the ECO requires a flip-flop to be implemented, gate array cells that are closest to the geometry center of all the cells sharing the same net as the flip-flop are located. It should be clear to a person of ordinary skill in the art that other search criteria can be used in the search algorithm employed in the search mode. At times, however, limitations may render an automate search inefficient in locating ideal gate array cells for reconfiguration. For example, when some cells that are connected by the same net as the gate array cells are also to be reconfigured later, it is not possible to find the geometry center. The manual select mode is provided to allow user to visually select gate array cells.

As such, in step 504, the program determines whether the user selects the automatic or the manual search mode. The user selection is provided interactively to computer system 100. If the automatic search mode is selected, the search engine scans the data base to look for gate array cells that meet the search criteria discussed above (step 505). In the automatic search mode, information regarding the type of gate array cells (e.g., a flip-flop, an AND gate, etc.) to be implemented is automatically provided by monitoring the list storing the extra cells and their desired functionality. On the other hand, if the manual search mode is selected, the user manually selects the desired select gate array cells by drawing a box to surround these cells (step 509). The user is then required to provide as input the type of cell to be implemented. In response, a dialog window pops up to ask the user to confirm the type of cell (e.g., a flip-flop, an AND gate, etc.).

Upon selecting the gate array cells to be reconfigured, whether through the automatic or manual search mode, the gate array cells selected are reconfigured to change their functionality by modifying the net wiring pattern for the gate array cells selected. The ECO netlist file which contains the wiring instructions for the reconfigured gate array cells is later provided to the place-and-route CAD tool for reconfiguring the metal layers.

As illustration of how selected gate array cells are reconfigured, consider the following example which assumes that the ECO requires an additional flip-flop be implemented. Assume also that three gate array cells are required to make up a flip-flop. After three adjacent gate array cells (GATE_P_1, GATE_P_2, GATE_P_3) are selected, either by automatic search or manual search, the coordinate location of cell GATE_P_1 is recorded as the coordinate location of the flip-flop X_FL02 (i.e., gate array cells reconfigured to have the same functionality as a standard filp-flop cell FL02) to be created. The three gate array cells are deleted from the original netlist file and replaced with flip-flop X_FL02. The ECO netlist file is merged with the original netlist file and the merged file is provided to the place-and-route CAD tool.

The instruction codes for the CAD tools discussed above are included in the appendix. Additionally, the supporting instruction codes for the CAD tool such as header files (i.e., for definition, initialization, and support) and graphics user interface files to allow users to interact with the CAD tools are also include in the appendix.

The preferred embodiment of the present invention, a method and system to allow ECO changes to be implemented into an integrated circuit layout more efficiently, is thus described. While the present invention has been described in particular embodiments, the present invention should not be construed as limited by such embodiments, but rather construed according to the below claims.

What is claimed is:

1. A method to implement modifications to an integrated circuit layout having configurable gate array cells, the method comprising the steps of:

compiling a first netlist file describing at least an arrangement of the configurable gate array cells and net connections of the configurable gate array cells in the layout;

compiling a second netlist file describing at least one engineering change order modification to be made to the integrated circuit layout;

comparing the first netlist to the second neltist file;

determining from the first netlist and the second netlist whether the engineering change order modification required additional functionality; and configuring selected gate array cells to provide the additional functionality as required by comparing the first netlist to the second netlist, wherein the selected gate array cells are configured by connecting the gate array cells according to a predetermined net connectivity pattern, wherein configuration of the selected gate array cells is carried out on metal layers of the integrated circuit layout.

2. The method in claim 1, wherein the configurable gate array cells in the integrated circuit layout including spare configurable gate array cells for use in ECO modifications.

3. The method in claim 1, wherein gate array cells are automatically selected to provide the additional functionality based on the criteria that they are located closest to gate array cells connecting to a common net to which, upon being configured, the selected gate array cells are also connected.

4. The method of claim 1, wherein gate array cells are user selected to provide the additional functionality.

5. The method of claim 1 further comprising the step of merging the first netlist file with the second netlist file to create a merge netlist file.

6. The method of claim 5 further comprising the step of providing the merged netlist file to a place-and-route computer-aided-design (CAD) tool to generate a modified integrated circuit layout.

7. The method of claim 6 further comprising the step of determining whether the first netlist specifies a function that is not specified by the second netlist.

8. The method of claim 7, wherein a warning is provided when the first netlist specifies a function that is not specified by the second netlist.

9. A computer system adapted to incorporate engineering change order (ECO) modifications to an integrated circuit layout having configurable gate array cells, the computer system comprising:

a bus;

a central processor coupled to the bus; and a memory coupled to the bus, the memory storing instruction codes, the instruction codes when executed by the central processor performs the steps of comparing a first netlist file with a second netlist file, the first netlist file containing at least a description of an arrangement of the configurable gate array cells and net connections of the configurable gate array cells in the integrated layout, the second netlist file containing at least a description of ECO modifications to be made to the integrated circuit layout; determining from the first and second netlists whether the ECO modifications require additional functionality; and configuring selected gate array cells to provide the additional functionality as required by the second netlist, wherein the selected gate array cells are configured by connecting the gate array cells according to a predetermined net connectivity pattern, wherein configuration of the selected gate array cells is carried out on metal layers of the integrated circuit layout.

10. The computer system in claim 9, wherein the configurable gate array cells in the integrated circuit layout including spare configurable gate array cells for use in ECO modifications.

11. The computer system in claim 9, wherein the executed instruction codes automatically selecting gate array cells to provide the additional functionality based on the criteria that they are located closest to gate array cells connecting to a common net to which, upon being configured, the selected gate array cells are also connected.

12. The computer system of claim 9, wherein the executed instruction codes allow a user to select gate array cells to provide the additional functionality.

13. The computer system of claim 9, wherein the executed instruction codes merging the first netlist file with the second netlist file to create a merge netlist file.

14. The computer system of claim 13, wherein the executed instruction codes providing the merged netlist file to a place-and-route computer-aided-design (CAD) tool to generate a modified integrated circuit layout.

15. The computer system of claim 14, wherein the executed instruction codes determining whether the first netlist specifies a function that is not specified by the second netlist.

16. The computer system of claim 15, wherein the executed instruction codes providing a warning when the first netlist specifies a function that is not specified by the second netlist.

* * * * *